United States Patent

Fujimoto et al.

Patent Number: 5,949,807
Date of Patent: Sep. 7, 1999

[54] SEMICONDUCTOR LASER DEVICE

[75] Inventors: Tsuyoshi Fujimoto; Yumi Naito, both of Sodegaura, Japan

[73] Assignee: Mitsui Chemicals, Inc., Tokyo, Japan

[21] Appl. No.: 08/860,489

[22] PCT Filed: Dec. 25, 1995

[86] PCT No.: PCT/JP95/02677

§ 371 Date: Sep. 22, 1997

§ 102(e) Date: Sep. 22, 1997

[87] PCT Pub. No.: WO96/20522

PCT Pub. Date: Jul. 4, 1996

[30] Foreign Application Priority Data

Dec. 28, 1994 [JP] Japan .................................. 6-329031
Jul. 21, 1995 [JP] Japan .................................. 7-186072
Jul. 27, 1995 [JP] Japan .................................. 7-192211

[51] Int. Cl.$^6$ ...................................................... H01S 3/19
[52] U.S. Cl. ................................................................ 372/45
[58] Field of Search ................................................... 372/45

[56] References Cited

U.S. PATENT DOCUMENTS 5,737,350  4/1998  Motoda et al. ............................ 372/45
5,811,839  9/1998  Shimoyama et al. ..................... 372/45

FOREIGN PATENT DOCUMENTS 578836   1/1994  European Pat. Off. .
6232512  8/1994  Japan .
9316513  8/1993  WIPO .

OTHER PUBLICATIONS

Shubert, E. F. "Delta doping of III–V compound semiconductors: Fundamentals and device applications." *Journal of Vacuum Science Technology A*, vol. 8, No. 3, (May/Jun. 1990), pp. 2980–2996.

Kozen, Atsuo et al. "Metalorganic–vapor–phase–epitaxial growth of Mg–doped $Ga_{1-x}Al_xAs$ layers and their properties." *Journal Applied Physics*, vol. 59, No. 4, (Feb. 15, 1986), pp. 1156–1158 5(1)—(4).

Hausser, S. et al. "1.3μm Multiquantum Well Decoupled Confinement Heterostructure (MQW–DCH) Laser Diodes." *IEEE Journal of Quantum Electronics*, vol. 29, No. 6, (Jun. 1993), pp. 1596–1600.

Guido, L. et al. "Carbon–doped $Al_xGa_{1-x}As$–GaAs quantum well lasers." *Applied Physics Letter*, vol. 52 No. 7, (Feb. 15, 1988), pp. 522–524.

Patent Abstracts of Japan—JP 6 013334—Jan. 21, 1994.

(List continued on next page.)

*Primary Examiner*—James W. Davie

[57] ABSTRACT

As shown in FIG. 1, on a semiconductor substrate 20 formed in sequence are a second n-type clad layer 11, a first n-type clad layer 12, an n-type carrier blocking layer 13, an active layer 14, a p-type carrier blocking layer 15, a first p-type clad layer 16, a second p-type clad layer 17, a current constriction layer 18, and a p-type contact layer 19. The carrier blocking layers 13 and 15 are doped to a high doping concentration of more than $1\times10^{18}$ cm$^{-3}$. The first clad layers 12 and 16 and the second clad layers 11 and 17 are doped to a low doping concentration of less than $3\times10^{17}$ cm$^{-3}$. The p-type carrier blocking layer 15 is doped with carbon or magnesium which is low in the diffusivity. Accordingly, the carriers are successfully confined in the active layer 14 thus to suppress the internal loss and the electrical resistance, whereby a high-efficiency, high-output semiconductor laser device can be obtained.

10 Claims, 10 Drawing Sheets

OTHER PUBLICATIONS

"Quantum Well Lasers with Carbon Doped Cladding Layers Grown by Solid Source Molecular Beam Epitaxy" M. Micovic, et al., Applied Physics Letters, vol. 64, No. 4, Jan. 24, 1994, pp. 411–413.

"Spectral Linewidth and Linewidth Enhancement Factor in 1.5 UM Modulation–Doped Strained MQW Lasers" H. Mawatari, et al. International Conference on Solid State Devices and Materials, Aug. 29, 1993, pp. 1041–1043.

"Modulation–Doped Multi–Quantum Well (MD–MQW) Lasers II. Experiment" K. Uomi, et al. Japanese Journal. of Applied Physics, vol. 29, No. 1, Part 01, Jan. 1, 1990, pp. 88–94.

Patent Abstracts of Japan—JP 4 206886 dated Jul. 28, 1992.

Patent Abstracts of Japan—JP 1 214083 dated Aug. 28, 1989.

FIG. 1 (a)
FIG. 1 (b)
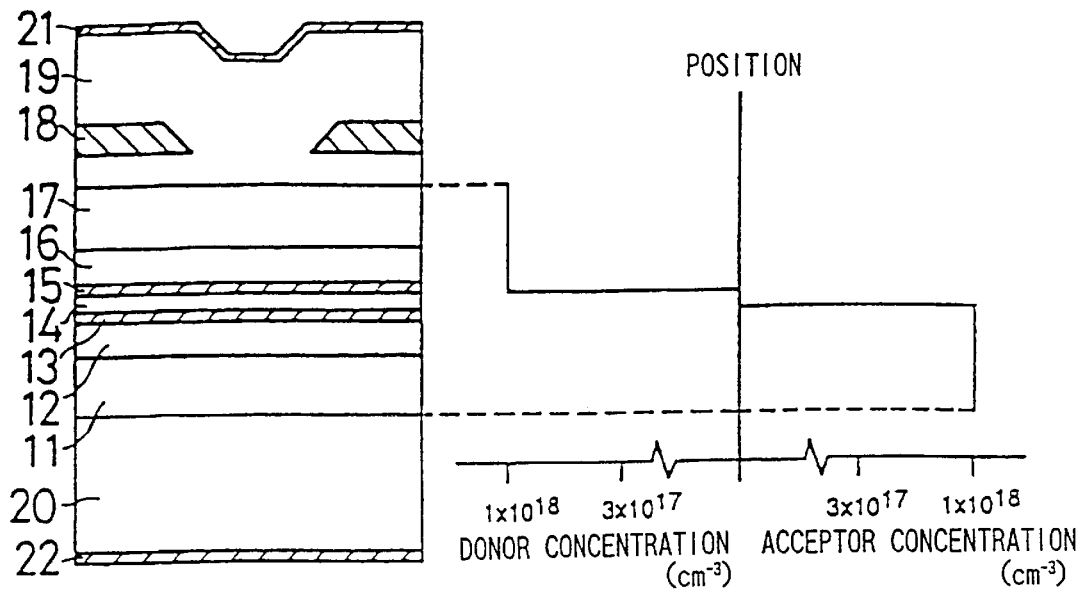
FIG. 2
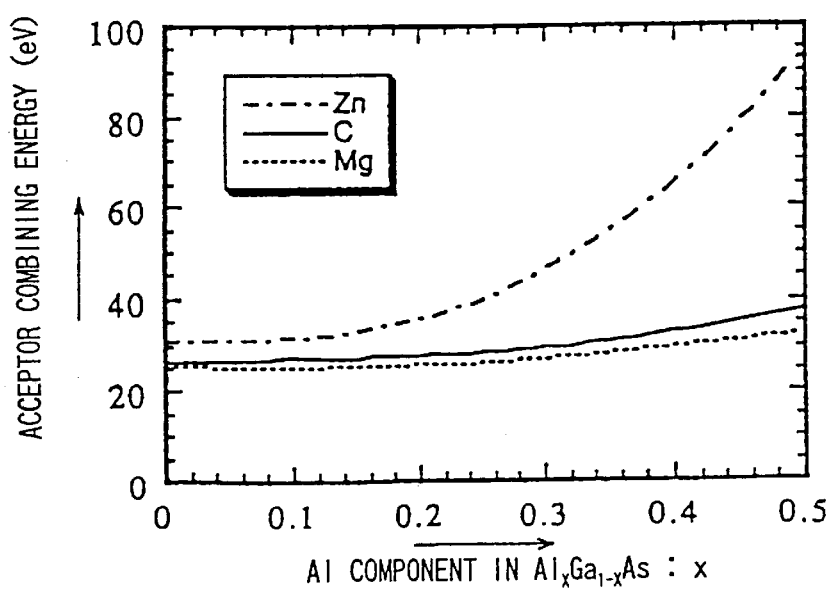

FORBIDDEN BAND IN MODULATION DOPED MULTI-QUANTUM WELL STRUCTURE

□ BARRIER LAYER (NOT DOPED)

▨ QW LAYER (NOT DOPED)

▨ DOPED REGION (C:$1\times10^{18}cm^{-3}$)

FORBIDDEN BAND IN SCH STRUCTURE

FORBIDDEN BAND IN PERFECT SCH STRUCTURE

SEMICONDUCTOR LASER DEVICE

TECHNICAL FIELD

The present invention relates to a semiconductor laser device capable of high output operation at high efficiency, which is preferably utilized for communication, laser printers, laser medical treatment, and laser machining and so on.

BACKGROUND ART

For the purpose of increasing in output of a semiconductor laser device, a type of semiconductor laser device has been proposed in which the degree of freedom in the energy band gaps of clad layers formed on the outer sides of carrier blocking layers is increased by providing the carrier blocking layers having a wide band gap and a small thickness on both sides of an active layer. In such a construction, the carrier blocking layers efficiently confine injected carriers into the active layer and since the carrier blocking layers are formed thin, light generated in the active layer can easily pass therethrough and leak out to the outer clad layers. This prevents instantaneous optical damage which is caused by intensive concentration of laser beam at the output end facets of the semiconductor laser device, and increases the COD (Catastrophic Optical Damage) level on the output end facets hence permitting a higher laser output.

FIG. 11(a) is a cross sectional view of such a semiconductor laser device, FIG. 11(b) is a profile of band gaps in their respective layers, and FIG. 11(c) is a profile of the effective index of refraction in case where the carrier blocking layers and the active layer are formed adequately thin so as to hardly affect the waveguide mode. The construction shown in FIG. 11 is called perfect SCH (PCT International Publication No. WO093/16513) in comparison with a known separate confinement heterostructure (SCH).

Referring to FIG. 11(a), formed on an n-GaAs semiconductor substrate (not shown) are, sequentially from lower, a second n-type clad layer (n-AlGaAs) 1, a first n-type clad layer (n-AlGaAs) 2, an n-type carrier blocking layer (n-AlGaAs) 3, an active layer (a GaAs/AlGaAs multi-quantum well layer) 4, a p-type carrier blocking layer (p-AlGaAs) 5, a first p-type clad layer (p-AlGaAs) 6, and a second p-type clad layer (p-AlGaAs) 7.

As shown in FIG. 11(b), the band gap in each of the carrier blocking layers 3 and 5 is greater in width than that in any of the active layer 4 and the clad layers 1, 2, 6, and 7, thus allowing injected carriers to be effectively confined in the active layer 4. Accordingly, the number of carriers which stimulates the laser oscillation will be increased hence improving the efficiency of laser oscillation.

When the carrier blocking layers and the active layer are thin enough to hardly affect the waveguide mode, an effective distribution of refractive index, as shown in FIG. 11(c), is of a slab waveguide structure in which the first n-type clad layer 2 to the first p-type clad layer 6 constitute a portion of high refractive index and each of the second n-type clad layer 1 and the second p-type clad layer 7 constitute portions of low refractive index. Accordingly, light generated in the active layer 4 propagates throughout the high refractive index portion, and as a consequence the peak intensity in the waveguide mode becomes low and hence an optical damage on the output end facets hardly occurs, whereby a high output semiconductor laser device can be realized.

In addition, there is reported an InGaAsP/InP semiconductor laser device of MQW-DCH (multi-quantum well-decoupled confinement heterostructure) provided with hole barrier layers (IEEE, Journal of Quantum Electronics, vol.29, No.6, June 1993, pp. 1596–1600).

In order to obtain a semiconductor laser device of high-output and high-efficiency, it is important to reduce the internal loss due to absorption of free carriers as well as to efficiently confine the injected carriers in the active layer.

In a perfect SCH semiconductor laser device, the injected carriers are successfully confined in the active layer by the carrier blocking layers which has a widest band gap among the layers and is adjacent to the active layer. Since this carrier blocking layer allows light to easily leak out to the clad layers, generally the carrier blocking layer is formed into a very thin layer having a thickness of 0.01 to 0.03 $\mu$m in the thickness. In case where the doping concentration of the carrier blocking layer which is formed to have a wide band gap and be very thin is inadequate, depletion of the whole carrier blocking layer occurs, resulting in inadequate confinement of the carriers in the active layer. The carrier blocking layer is thus required for increasing the doping concentration by use of a dopant having a high doping efficiency and a low diffusivity. However, zinc, which is commonly used as a p-type dopant is an element which is easily diffused in bulk form. Accordingly, the diffusion length of zinc drastically exceeds the thickness of the carrier blocking layer, hence it is impossible to form a high doping concentration in the very thin carrier blocking layers.

The efficiency of the semiconductor laser device largely depends on levels of internal loss caused by absorption of free carriers. The free carrier absorption is controlled by the doping concentration of each layer where light is propagated. The higher the doping concentration, the more the internal loss increases. Accordingly the doping concentration of each layer where light is propagated is required to be lowered at a minimum essential level.

FIG. 12(a) illustrates a band gap distribution in an SCH semiconductor laser device and FIG. 12(b) shows a band gap distribution in a perfect-SCH semiconductor laser device, which show examples where the active layer comprises a quantum well layer and two barrier layers sandwiching the quantum well layer.

In the SCH shown in FIG. 12(a), the clad layers formed to have wide band gaps and large thicknesses confine injected carriers into the active layer. Although the carriers in the active layer is about to overflow toward the clad layers by thermal excitation, they are diffused back into the active layer in a certain probability due to the thick clad layers. Accordingly a high efficiency for confining the carriers in the active layer can be attained, however since the waveguide mode concentrates in the active layer, a high output operation may easily cause damages on the end facets.

In the perfect-SCH of FIG. 12(b), the injected carriers are confined into the active layer by the carrier blocking layers which is adjacent to the active layer and have a widest band gap among the layers. For the purpose of allowing light to easily leak out to the clad layers, the carrier blocking layer is formed generally so as to have a small thickness of 0.01 to 0.03 $\mu$m. The waveguide mode is thus extended and improvement of COD level is achieved, resulting in a high output operation.

The carriers which have flowed over the carrier blocking layers are distributed in the first clad layers which have smaller band gaps than those of the carrier blocking layers, as shown in FIG. 12(b). In this case, if once some carriers have overflowed, the overflowed carriers are prevented from diffusing back into the active layer by the high potential barriers of the carrier blocking layers. Accordingly, in the perfect-SCH, the efficiency of confinement of the carriers into the active layer will be easily decreased, and therefore it is necessary to suppress the overflow of the carriers.

For the purpose, the band gaps in the carrier blocking layers are increased to enhance a carrier blocking function.

However a material usable for the carrier blocking layer has a limit in band gap. Particularly in a III–V semiconductor compound such as AlGaAs, even though a wide band gap type of material is used, the offset of conduction band does not increase because the band edges become indirect transition type.

Also, the effective mass of conductive electrons is small and when the electron quasi-Fermi level ascends as the carriers are injected, the overflow of electrons will hardly be negligible.

DISCLOSURE OF THE INVENTION

It is an object of the present invention to ensure the confinement of carriers in an active layer and also to suppress the internal loss to a lower level to provide a high-efficiency and high-output semiconductor laser device.

It is another object of the present invention to suppress the optical damage of output end facets which bars the high energy output and to provide a semiconductor laser device capable of further facilitating high energy output.

It is a further object of the present invention to ensure the confinement of carriers in an active layer, in particular to stop the overflow of electrons which will cause a problem and to provide a high-efficiency and high-output semiconductor laser device.

The present invention provides a semiconductor laser device comprising n-type and p-type clad layers disposed on both sides of an active layer; and n-type and p-type carrier blocking layers which are disposed adjacent to the active layer, and have wider band gaps than those of the active layer and the clad layers, wherein a dopant of the p-type carrier blocking layer is carbon or magnesium.

According to the present invention, carbon or magnesium, which is high in doping efficiency and low in diffusivity, is used as a dopant of the p-type carrier blocking layer, whereby a dopant can be doped at a high concentration in production process. In case that the carrier blocking layer is very thin, the diffusion of the dopant which occurs during the production can be declined to a practically negligible level. More specifically, either carbon or magnesium in bulk form is low in the diffusivity and its diffusion length becomes small to a practically negligible level than the thickness of the carrier blocking layer. As a result, in case that the carrier blocking layer is extremely thin, a high doping concentration can be realized.

Furthermore, as shown in FIG. 1, the active layer region is formed undoped and the doping concentrations of the n-type and p-type carrier blocking layers 13 and 15 adjacent to the active layer are formed high, whereby depletion in the carrier blocking layers 13 and 15 is suppressed to maintain a potential barrier to a sufficient level, resulting in effective confinement of the injected carriers into the active layer 14. Conventionally it is common to use zinc as a p-type dopant. Zinc is however an element having high in the diffusivity particularly in bulk form and the diffusion length of zinc during the production is extremely increased as compared with the thickness of the carrier blocking layer. As the result, the carrier blocking layer having a small thickness fails to be high in the doping concentration. Also, parts of zinc diffused in the active layer may cause broadening of the light emission spectrum.

In case where the carrier blocking layers are formed In thickness of e.g. 0.01 to 0.03 $\mu$m, by using carbon or magnesium which is low in the diffusivity the step type doping described above can be easily realized. This enhances the carrier blocking function and decreases useless currents which hardly contribute to recombination for emission and improves the temperature dependence (characteristic temperature) of oscillation threshold, thus increasing the efficiency of laser oscillation.

As to the diffusion constant of each element in GaAs, there are reports that the diffusion constant of carbon C under a proper condition is $1\times10^{-15}$ cm$^2$/sec at 900° C. (Literature 1), that of magnesium Mg is $1.4\times10^{-13}$ cm$^2$/sec at 900° C. (Literature 2), and that of zinc Zn is $3.2\times10^{-8}$ cm$^2$/sec at 900° C. (Literature 2). Literature 1: Journal Vacuum Science Technology A, vol.18, No.3, May/June 1990, p.2980, and Literature 2: Journal Applied Physics, 59(4), 15(1986), p.1156.) As apparent, carbon is lower in the diffusivity by an order of seven digits and magnesium is lower by an order of five digits than zinc. Hence, carbon is most preferably used as the dopant. Incidentally the diffusion length is proportional to a square root of the diffusion constant.

FIG. 2 is a graphic diagram showing the acceptor level of p-type dopants in AlGaAs, in which the abscissa represents a content x of Al component. The acceptor level of zinc becomes deep as the Al component increases. On the other hand, carbon or magnesium is an element which form an acceptor level shallower than zinc as a whole while the Al content x varies. Hence, the potential barrier against electrons in the p-type carrier blocking layer 15 will be raised thus enhancing the carrier confinement.

It is preferable in the present invention that modulation doping is applied to the n-type and p-type carrier blocking layers so that doping amounts of the n-type and p-type carrier blocking layers are greater than that of at least one of the n-type and p-type clad layers adjacent to the carrier blocking layers.

This allows the carrier blocking layers to enhance the carrier confinement into the active layer and the clad layers where light is propagated to be decreased in the concentration of free carriers, thus suppressing the internal loss.

It is also preferable in the invention that modulation doping is applied so that doping amounts of the n-type and p-type carrier blocking layers are $1\times10^{18}$ cm$^{-3}$ or more, a doping amount of at least one of the n-type and p-type clad layers adjacent to the carrier blocking layers is $3\times10^{17}$ cm$^{-3}$ or less.

As employing modulation doping where the doping amount is more than $1\times10^{18}$ cm$^{-3}$ in the n-type and p-type carrier blocking layers and less than $3\times10^{17}$ cm$^{-3}$ in the n-type and p-type clad layers, the carrier confinement function is adequately maintained and the internal loss will be suppressed. In addition because excessive doping in the carrier blocking layers may result in high absorption of free carriers or declination of the crystalline property, the doping amount Is preferable to be limited up to $1\times10^{19}$ cm$^{-3}$. A minimum of the doping amount in the clad layers is preferably $1\times10^{16}$ cm$^{-3}$ for preventing increase of the electrical resistance.

Furthermore the invention provides a semiconductor laser device comprising n-type and p-type clad layers disposed on both side s of an active layer; and n-type and p-type carrier blocking layers which are adjacent to the active layer and have wider band gaps than those of the active layer and the clad layers, wherein the active layer has a single-quantum or multi-quantum well structure composed of rising quantum well layers and barrier layers of which band gap is wider than that of the quantum well layers, and the barrier layers are doped with carbon or magnesium.

According to the invention, the barrier layers in the quantum well structure of the active layer are doped with carbon or magnesium by so-called modulation doping. FIG. 3 is profile of the band gap distribution In the modulation doped multi-quantum well structure. There are formed three barrier layers between and on the outer side of the two quantum well layers. Since the barrier layers are doped with carbon or magnesium, the holes are moved to and localized in the quantum well layers where the band gap is small. Accordingly, the concentration of the holes in the quantum well layers will be high.

FIG. 4 is a graphic diagram showing optical gain to injected carrier concentration. The injected carrier concentration along the abscissa represents a number of carriers per unit area of one square centimeter in the single-quantum well structure. The optical gain of the semiconductor laser device is shown along the ordinate. Each of the curves show the optical gain as varied with the doping concentration in the barrier layers. The curve L1 is with no doping in the barrier layers, L2 is with a doping concentration of $5\times10^{17}$ cm$^{-3}$, L3 is with a doping concentration of $1\times10^{18}$ cm$^{-3}$, L4 is with a doping concentration of $1.5\times10^{18}$ cm$^{-3}$, and L5 is with a doping concentration of $2\times10^{18}$ cm$^{-3}$.

As apparent from the graph, the optical gain increases as the injected carrier concentration increases and also, as the doping concentration in the barrier layers becomes higher. Because any excessive doping may cause discrepancy of the lattice constant, an upper limit of the doping concentration is preferably $1\times10^{19}$ cm$^{-3}$ and more preferably, the doping concentration exists within a range of $1\times10^{17}$ to $1\times10^{19}$ cm$^{-3}$.

Increase of the hole concentration in the quantum well can decrease the quasi-Fermi level of electron in the active layer during laser oscillation (with the gain being constant) lower than in the art. This will decline the overflow of electron in the active layer over the carrier blocking layers hence enhancing the carrier confinement in the active layer.

Particularly, when the quantum well layer and the barrier layers in the active layer are made of AlGaAs semiconductor compound, a phenomenon that the quasi-Fermi level of electron during the laser oscillation ascends too high because the effective mass ratio between hole and electron is as high as nearly 7 can be prevented, while the carrier overflow will be declined. This considerably reduces unless currents which hardly contribute to the recombination for laser emission hence improving the temperature dependence (characteristic temperature) of oscillation threshold.

Since carbon or magnesium used as the dopant is small in the diffusivity, the doping concentration can be successfully increased in a narrow area with the diffusion being suppressed during the production. This can realize the modulation doping in which the quantum well layers are undoped and the barrier layers are doped. Also, disorder in the quantum well structure due to diffusion or increase of the oscillation threshold due to extension of the laser spectrum can be avoided.

It is also preferable in the present invention that each of the n-type and p-type clad layers comprises, in order from the active layer side, a first clad layer and a second clad layer, and when a normalized frequency V is defined as follows:

$$V=(\pi \cdot d1/\lambda)\cdot(N1^2-N2^2)^{0.5}$$

wherein $\pi$ is the circular constant, $\lambda$ is the oscillation wavelength, N1 is the maximum refractive index of the first clad layer, N2 is the refractive index of the second clad layer, and d1 is the effective thickness between the second clad layers, the normalized frequency V satisfies $V>\pi/3$ When the index of refraction in the first clad layer is constant, the maximum refractive index N1 is a constant value. If the refractive index varies in the first clad layer, N1 is the maximum value. The effective thickness d1 is calculated from the following equation:

$$d1 = \int_{x1}^{x2} (Nw(x) - N_2) dx / (N_1 - N_2) \qquad (1)$$

where Nw(x) is the refractive index at a specific point (x) between the two second clad layers, and x1 and x2 are the points on the interface of the second n-type clad layer adjacent to the active layer and that of the second p-type clad layer adjacent to the active layer, respectively.

As the doping is made with carbon or magnesium, the thickness of the carrier blocking layers adjacent to the active layer is decreased to as a low value as not affecting the waveguide mode. When the normalized frequency V of the waveguide which consists of the active layer, the carrier blocking layers and the first clad layer is more than $\pi/3$, the waveguide mode can be approximated an ideal Gaussian profile. Also, as the peak of the waveguide mode is declined in the active layer, the COD level on the output end facets of the semiconductor laser device will be increased. For preventing multi-mode oscillation, the normalized frequency V is preferably smaller than $2\pi$.

It is preferable in the invention that the carrier blocking layers and the clad layers are formed of a III–V group semiconductor compound.

The carrier blocking layers and clad layers formed of the III–V group semiconductor compound allows the dopant of carbon or magnesium to stay low in the diffusivity, hence increasing the doping concentration.

It is also preferable in the invention, the carrier blocking layers and the clad layers are formed of an AlGaAs base semiconductor compound.

The carrier blocking layers and clad layers formed of the AlGaAs base semiconductor compound allows the acceptor level formed by carbon or magnesium to remain shallow, as shown in FIG. 2, thus elevating the potential barrier in the carrier blocking layers. Also, the doping concentration of the carrier blocking layers can be formed higher due to the high doping efficiency and low diffusivity.

It is preferable in the invention that the quantum well layer and the barrier layers are formed of a III–V group semiconductor compound.

It is also preferable in the invention that the quantum well layer and the barrier layers are formed of an AlGaAs base semiconductor compound.

The quantum well layer and the barrier layers formed of the III–V group or AlGaAs base semiconductor compound allows the dopant of carbon or magnesium to stay low in the diffusivity, hence increasing the doping concentration in the barrier layer.

BRIEF DESCRIPTION OF DRAWINGS

FIG. 1(a) is a cross sectional view showing a first embodiment of the present invention while FIG. 1(b) is a profile diagram showing the doping concentration of layers from the first n-type clad layer to the second p-type clad layer;

FIG. 2 is a graphic diagram showing the acceptor level of p-type dopants in AlGaAs;

FIG. 11($c$) is a profile diagram showing the effective index of refraction.

BEST MODE FOR CARRYING OUT THE INVENTION

Embodiment 1

Figure 3:
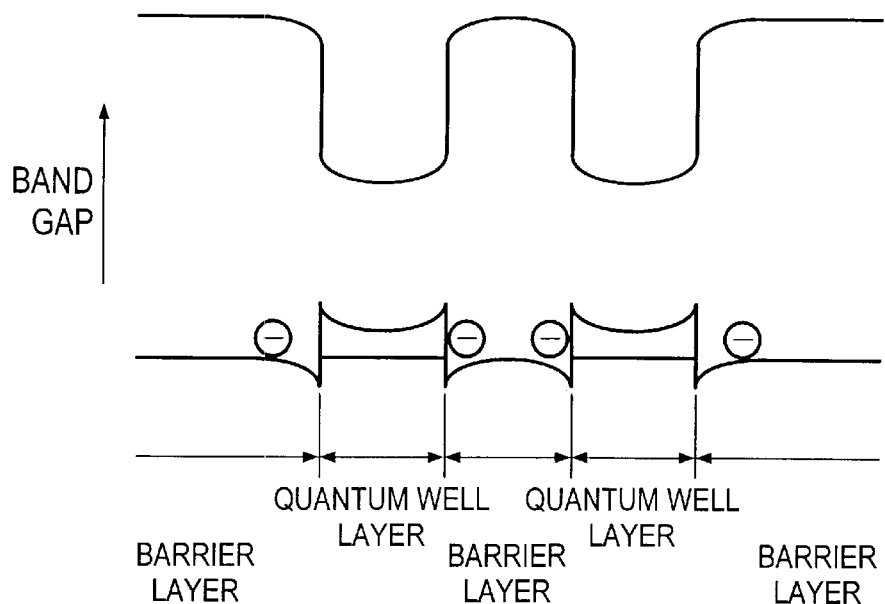
FIG. 3 is a view of band gap distribution in a multi-quantum well structure with modulation doping.
Figure 4:
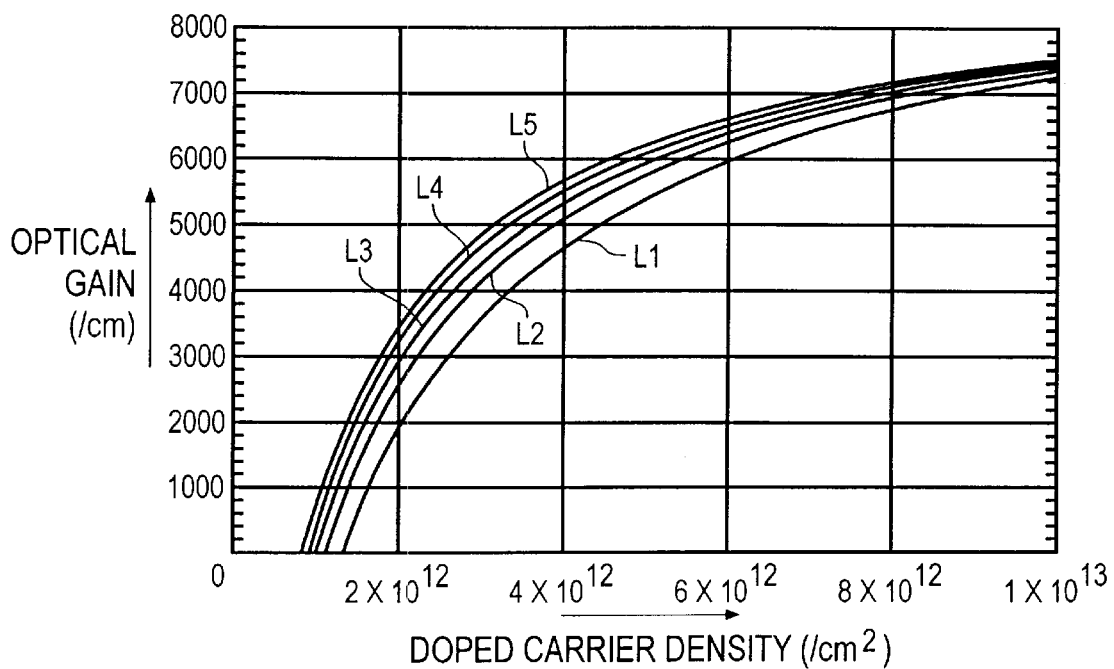
FIG. 4 is a graphic diagram showing the optical gain to injected carrier concentration.

FIG. 1($a$) is a cross sectional view showing a first embodiment of the present invention. In this semiconductor laser device, on a semiconductor substrate (n-GaAs) 20 formed in sequence are a second n-type clad layer (n-$Al_{0.48}Ga_{0.52}As$ with a donor concentration of $1\times10^{18}$ $cm^{-3}$ and a thickness of 0.7 $\mu m$) 11, a first n-type clad layer (n-$Al_{0.31}Ga_{0.69}As$ with a donor concentration of $1\times10^{18}$ $cm^{-3}$ and a thickness of 0.4 $\mu m$) 12, an n-type carrier blocking layer (n-$Al_{0.60}Ga_{0.40}As$ with a donor concentration of $1\times10^{18}$ $cm^{-3}$ and a thickness of 0.014 $\mu m$) 13, an active layer (DQW: double-quantum well of GaAs/$Al_{0.31}Ga_{0.69}As$ without doping) 14, a p-type carrier blocking layer (p-$Al_{0.50}Ga_{0.50}As$ with an acceptor concentration of $1\times10^{18}$ $cm^{-3}$ and a thickness of 0.021 $\mu m$) 15, a first p-type clad layer (p-$Al_{0.31}Ga_{0.69}As$ with an acceptor concentration of $1\times10^{18}$ $cm^{-3}$ and a thickness of 0.4 $\mu m$) 16, a second p-type clad layer (p-$Al_{0.48}Ga_{0.52}As$ with an acceptor concentration of $1\times10^{18}$ $cm^{-3}$ and a thickness of 0.7 $\mu m$) 17, an current constriction layer (n-GaAs with a donor concentration of $1\times10^{18}$ $cm^{-3}$ and a thickness of 0.3 $\mu m$) 18, and a p-type contact layer (p-GaAs with an acceptor concentration of $3\times10^{17}$ $cm^{-3}$ to $1\times10^{19}$ $cm^{-3}$ and a thickness of 2 $\mu m$) 19 by metal organic chemical vapor deposition (MOCVD), where Se (selenium) is doped as donor and C (carbon) is doped except the p-type contact layer where Zn is doped.

Ohmic electrodes 21 and 22 are provided on the top of the p-type contact layer 19 and the bottom of the semiconductor substrate 20 respectively.

FIG. 1($b$) is a profile diagram showing the doping concentration of the layers from the second n-type clad layer 11 to the second p-type clad layer 17.

It should be noted that the p-type carrier blocking layer 15 is doped with carbon.

Comparison 1 employs zinc used as the acceptor and its other structure is identical to that of Embodiment 1.

Figure 5:
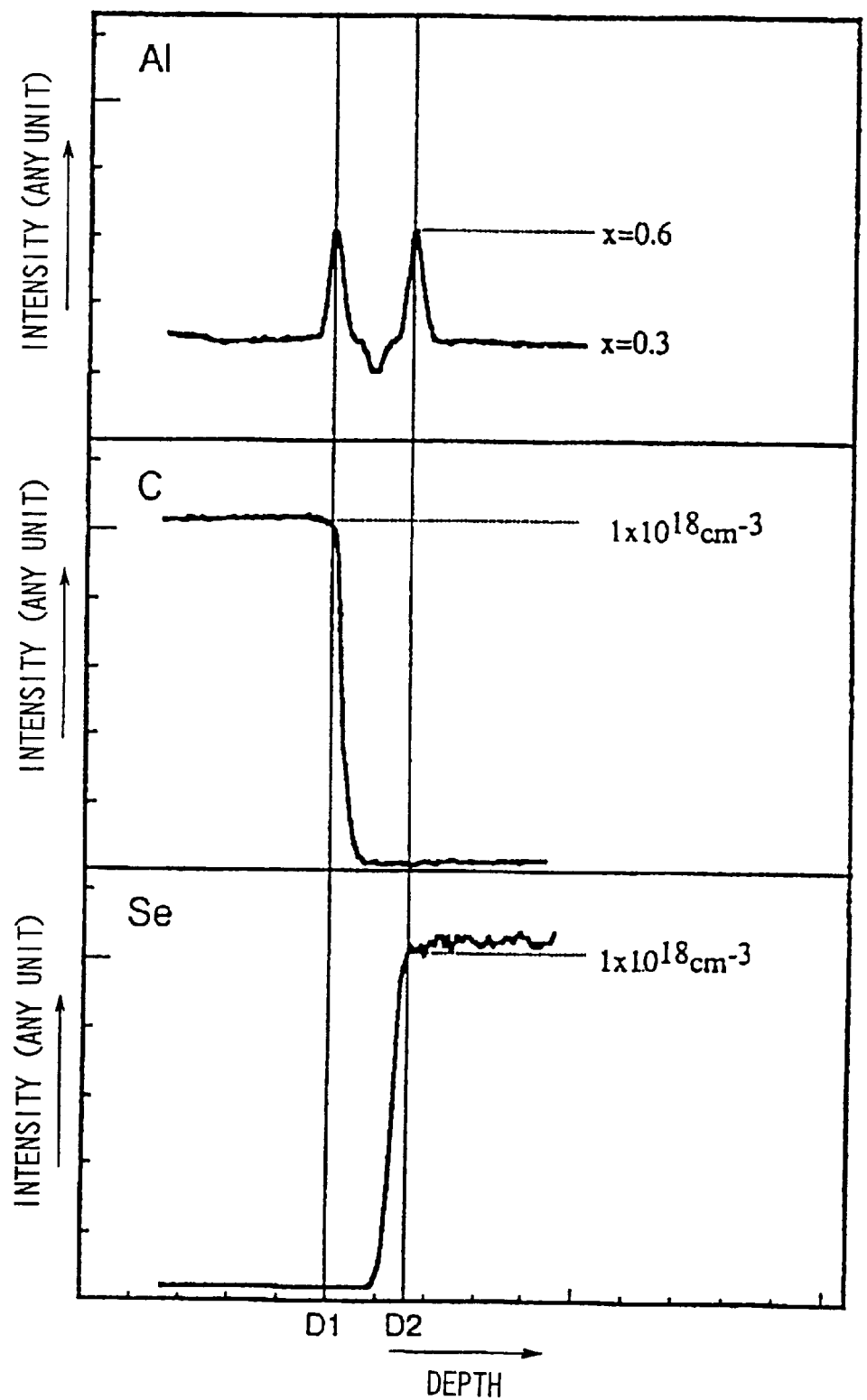
FIG. 5 is a profile diagram showing the concentration of various elements near the acrive layer in a sample corresponding to Embodimant 1 where carbon is used as the p-type dopant.
Figure 6:
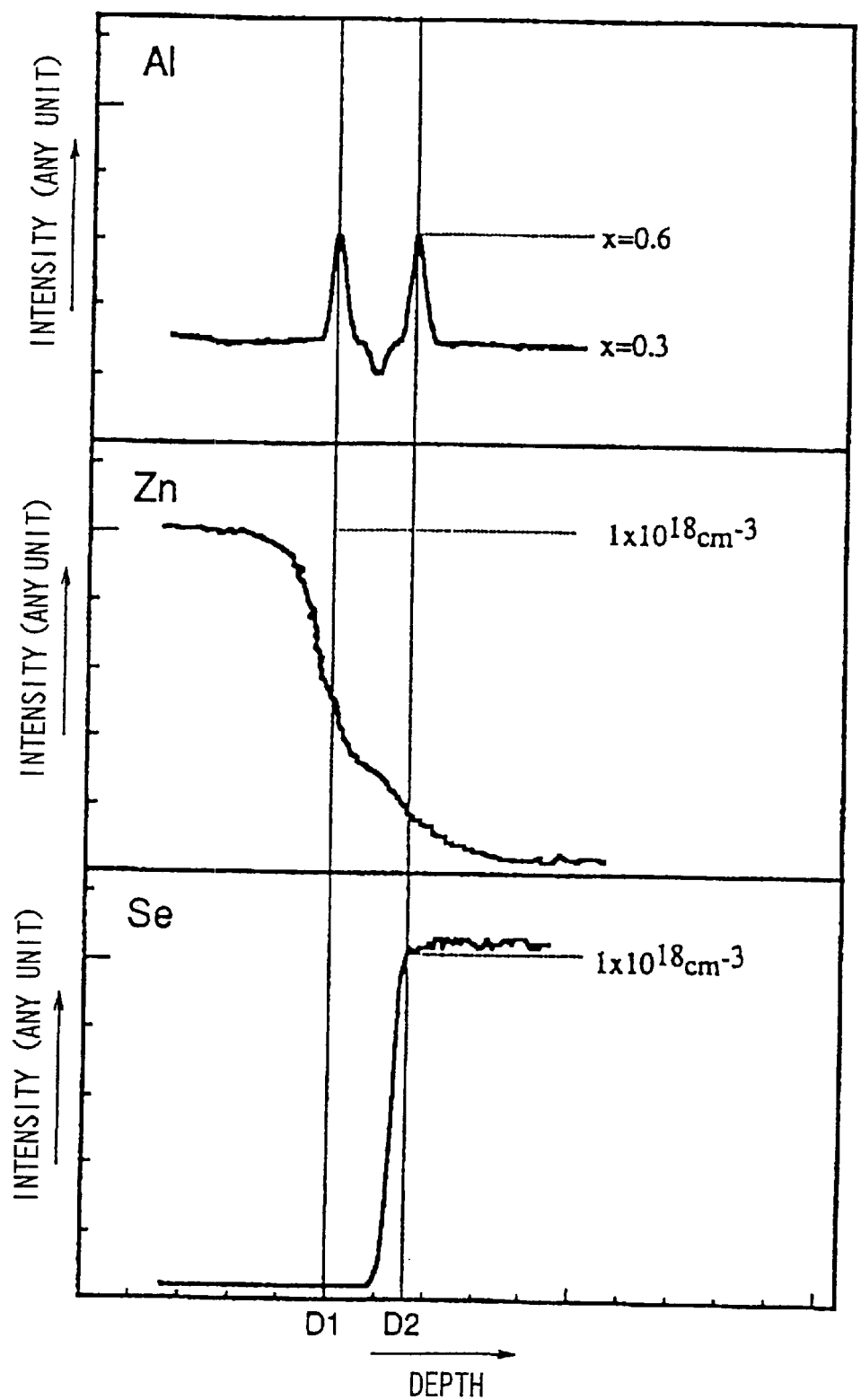
FIG. 6 is a profile diagram showing the concentration of various elements near the acrive layer in a sample corresponding to Comparison 1 where zinc is used as the p-type dopant.

FIGS. 5 and 6 are profile diagrams showing the concentration of various elements near active layer in a semiconductor laser device having a perfect-SCH formed by MOCVD. FIG. 5 corresponds to Embodiment 1 where carbon (C) is used as the p-type dopant. FIG. 6 corresponds to Comparison 1 where zinc (Zn) is used as the p-type dopant. The n-type dopant is selenium (Se) in both the cases. Samples used in FIGS. 5 and 6 are intended for measurement of the concentration. The sample of FIG. 5 is distinguished from the sample of Embodiment 1 by the fact that the p-type carrier blocking layer is made of $Al_{0.60}Ga_{0.40}As$ and the first clad layer is made of $Al_{0.30}Ga_{0.70}As$. Also, the sample of FIG. 6 is distinguished from the sample of Comparison 1 by the fact that the p-type carrier blocking layer is made of $Al_{0.60}Ga_{0.40}As$.

Each of the profiles shows a measurement of signal intensity with the element concentration detected by secondary ion mass spectrometer (SIMS) along the ordinates and a depth In the layer along the abscissa. The depth D1 corresponds to the position of the p-type carrier blocking layer and the depth D2 corresponds to the position of the n-type carrier blocking layer.

Refering to the Al content x shown in FIG. 5, it is intended that x=0.3 in the first p-type clad layer which is shallower than D1, x=0.6 at D1 in the p-type carrier blocking layer, x<0.3 in the active layer between D1 and D2, x=0.6 at D2 in the n-type carrier blocking layer, and x=0.3 in the first n-type clad layer which is deeper than D2. The Al content relates to the width of the band gap, namely the band gap is minimum in the active layer and maximum in both the carrier blocking layers. The active layer has a double-quantum well structure and its profile should exhibit more rises and falls, which are moderated due to the resolution of SIMS.

The element concentration of carbon dc in FIG. 5 is $1\times10^{18}$ $cm^{-3}$ in a region shallower than D1 and almost nil in a region deeper than D2.

Also, the element concentration of selenium ds in FIG. 5 is almost nil in a region shallower than D2 and $1\times10^{18}$ $cm^{-3}$ in a region deeper than D1.

In FIG. 6, the Al content x and the selenium concentration ds show profiles similar to those in FIG. 5, both are substantially consistent to each other respectively.

The element concentration of zinc dz in FIG. 6 is $1\times10^{18}$ $cm^{-3}$ in a region shallower than D1 and gradually declined towards D1. It is almost a half the peak value at D1. As apparent, the diffusivity of zinc is high. When the carrier blocking layer is thin, zinc will easily escape to the other layers hence hardly producing a high doping concentration. It is also apparent that the active layer is polluted with zinc.

On the other hand, carbon is an element low in the diffusivity and its doping concentration can be high even when the carrier blocking layer 15 is very thin. This prevents adverse depletion throughout the layer. Magnesium shows such a similar profile as that of carbon.

For comparison between Embodiment 1 and Comparison 1, the result of measuring the characteristic temperature and the internal loss of the semiconductor laser devices are shown in the following table (Table 1). The layer construction, the Al content x, and the doping concentration are identical to each other. A difference of Comparison 1 from Embodiment 1 is that the p-type carrier blocking layer 15 is doped with zinc. The other conditions including 700 $\mu$m of cavity length, 50 $\mu$m of current injection stripe width, and no optical coatings in the semiconductor laser devices are also identical. It is found from the comparison that the characteristic temperature representing the temperature dependence of oscillation threshold is improved from 120 K to 140 K. This may be explained by the fact that as the doping concentration in the carrier blocking layers is maintained to a desired level with the use of a dopant of carbon which is lower in the diffusivity than zinc, the carriers are successively confined in the active layer as compared with the case of zinc.

TABLE 1

| Dopant | Embodiment 1 Carbon | Embodiment 2 Carbon | Comparison 1 Zinc | Comparison 2 Zinc |
|---|---|---|---|---|
| Doping Concentration (cm$^{-3}$) | | | | |
| Carrier blocking layer | $1 \times 10^{18}$ | $1 \times 10^{18}$ | $1 \times 10^{18}$ | $1 \times 10^{18}$ |
| First clad layer | $1 \times 10^{18}$ | $3 \times 10^{17}$ | $1 \times 10^{18}$ | $3 \times 10^{17}$ |
| Second clad layer | $1 \times 10^{18}$ | $3 \times 10^{17}$ | $1 \times 10^{18}$ | $3 \times 10^{17}$ |
| Characteristic Temp. (K) | 140 | 140 | 120 | 90 |
| Internal loss (cm$^{-1}$) | 10 | 2 | 10 | 2 |

Embodiment 2

Figure 7:
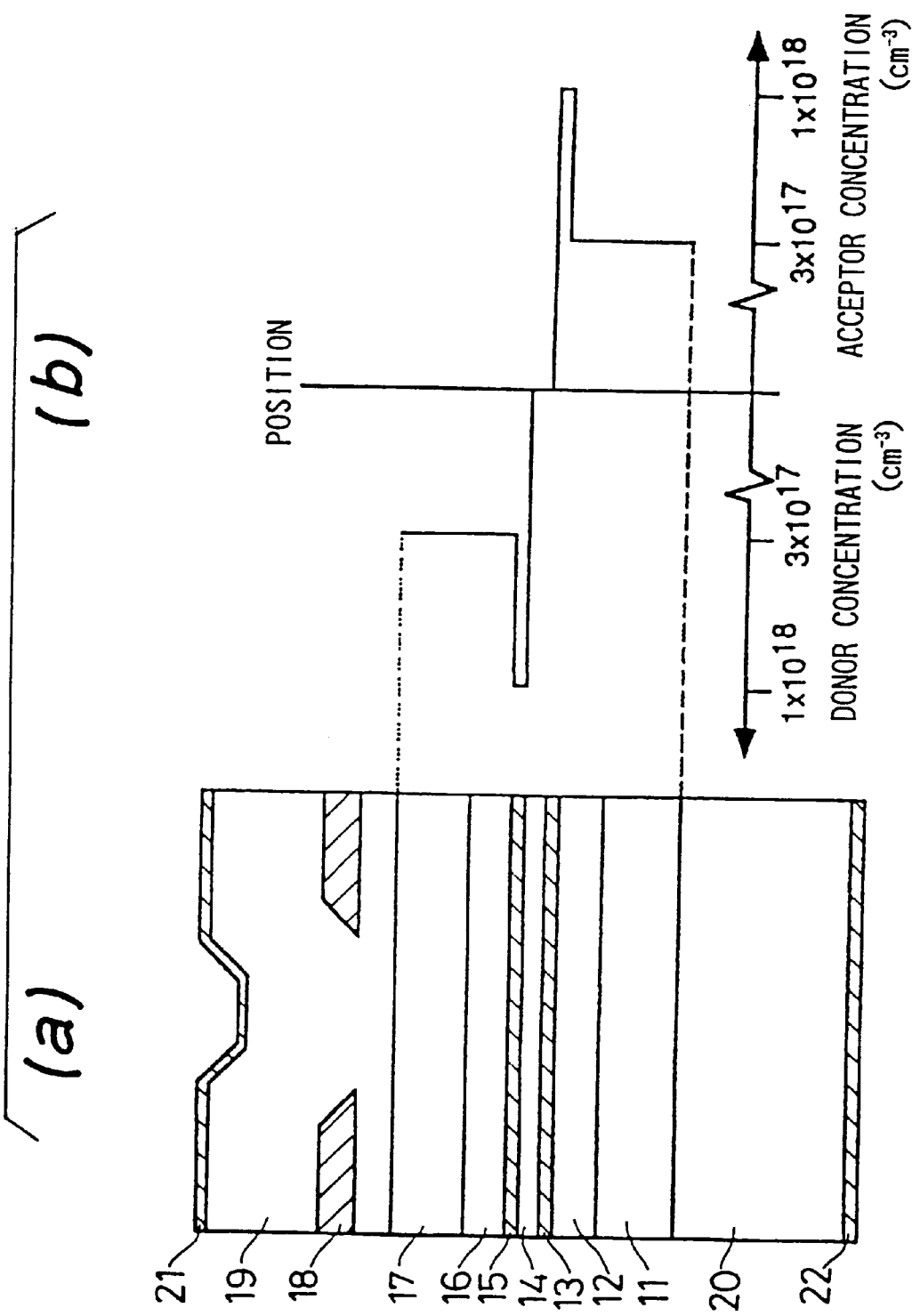
FIG. 7($a$) is a cross sectional view showing a second embodiment of the present invention while FIG. 7($b$) is a profile diagram showing the doping concentration of layers from the first n-type clad layer to the second p-type clad layer.

FIG. 7(a) is a cross sectional view showing a second embodiment of the present invention. In this semiconductor laser device, on a semiconductor substrate (n-GaAs) 20 formed in sequence are a second n-type clad layer (n-Al$_{0.48}$Ga$_{0.52}$As with a donor concentration of $3 \times 10^{17}$ cm$^{-3}$ and a thickness of 0.7 $\mu$m) 11, a first n-type clad layer (n-Al$_{0.31}$Ga$_{0.69}$As with a donor concentration of $3 \times 10^{17}$ cm$^{-3}$ and a thickness of 0.4 $\mu$m) 12, an n-type carrier blocking layer (n-Al$_{0.60}$Ga$_{0.40}$As with a donor concentration of $1 \times 10^{18}$ cm$^{-3}$ and a thickness of 0.014 $\mu$m) 13, an active layer (DQW: double-quantum well of GaAs/Al$_{0.31}$Ga$_{0.69}$As without doping) 14, a p-type carrier blocking layer (p-Al$_{0.50}$Ga$_{0.50}$As with an acceptor concentration of $1 \times 10^{18}$ cm$^{-3}$ and a thickness of 0.021 $\mu$m) 15, a first p-type clad layer (p-Al$_{0.31}$Ga$_{0.69}$As with an acceptor concentration of $3 \times 10^{17}$ cm$^{-3}$ and a thickness of 0.4 $\mu$m) 16, a second p-type clad layer (p-Al$_{0.48}$Ga$_{0.52}$As with an acceptor concentration of $3 \times 10^{17}$ cm$^{-3}$ and a thickness of 0.7 $\mu$m) 17, an current constriction layer (n-Gas with a donor concentration of $1 \times 10^{18}$ cm$^{-3}$ and a thickness of 0.3 $\mu$m) 18, and a p-type contact layer (p-GaAs with an acceptor concentration of $3 \times 10^{17}$ cm$^{-3}$ to $1 \times 10^{19}$ cm$^{-3}$ and a thickness of 2 $\mu$m) 19 by metal organic.chemical vapor deposition (MOCVD), where Se is doped as donor and C is doped as acceptor except the p-type contact layer where Zn is doped.

Ohmic electrodes 21 and 22 are provided on the top of the p-type contact layer 19 and the bottom of the semiconductor substrate 20 respectively.

FIG. 7(b) is a profile diagram showing the doping concentration of the layers from the second n-type clad layer 11 to the second p-type clad layer 17. It should be noted that both the donor concentration in the n-type carrier blocking layer 13 and the acceptor concentration in the p-type carrier blocking layer 15 are set to $1 \times 10^{18}$ cm$^{-3}$ or higher while the donor concentration in the second 11 and the first n-type clad layer 12 and the acceptor concentration in the first 16 and the second p-type clad layer 17 are set to $3 \times 10^{17}$ cm$^{-3}$ or lower as shown in FIG. 7(b), i.e. the modulation doping is applied.

Since the carrier blocking layers 13 and 15 are maintained high in the doping concentration, the depletion of the layers 13 and 15 is suppressed as a whole thus producing a higher potential barrier and efficiently confining injected carriers in the active layer 14. As the doping concentration in a light leaking region or the clad layers 11, 12, 16, and 17 is formed to a low level, the absorption of free carriers will be decreased thus improving the laser oscillation efficiency. The result of measuring the characteristic temperature and the internal loss in the semiconductor laser device of Embodiment 2 are also shown in Table 1 under the conditions including 700 $\mu$m of cavity length, 50 $\mu$m of current injection stripe width, and no optical coatings. As compared with Embodiment 1, the internal loss is remarkably reduced to $\frac{1}{5}$ while the characteristic temperature remains unchanged.

Comparison 2 is substantially identical to Embodiment 2, except that zinc is doped as acceptor.

Figure 8:
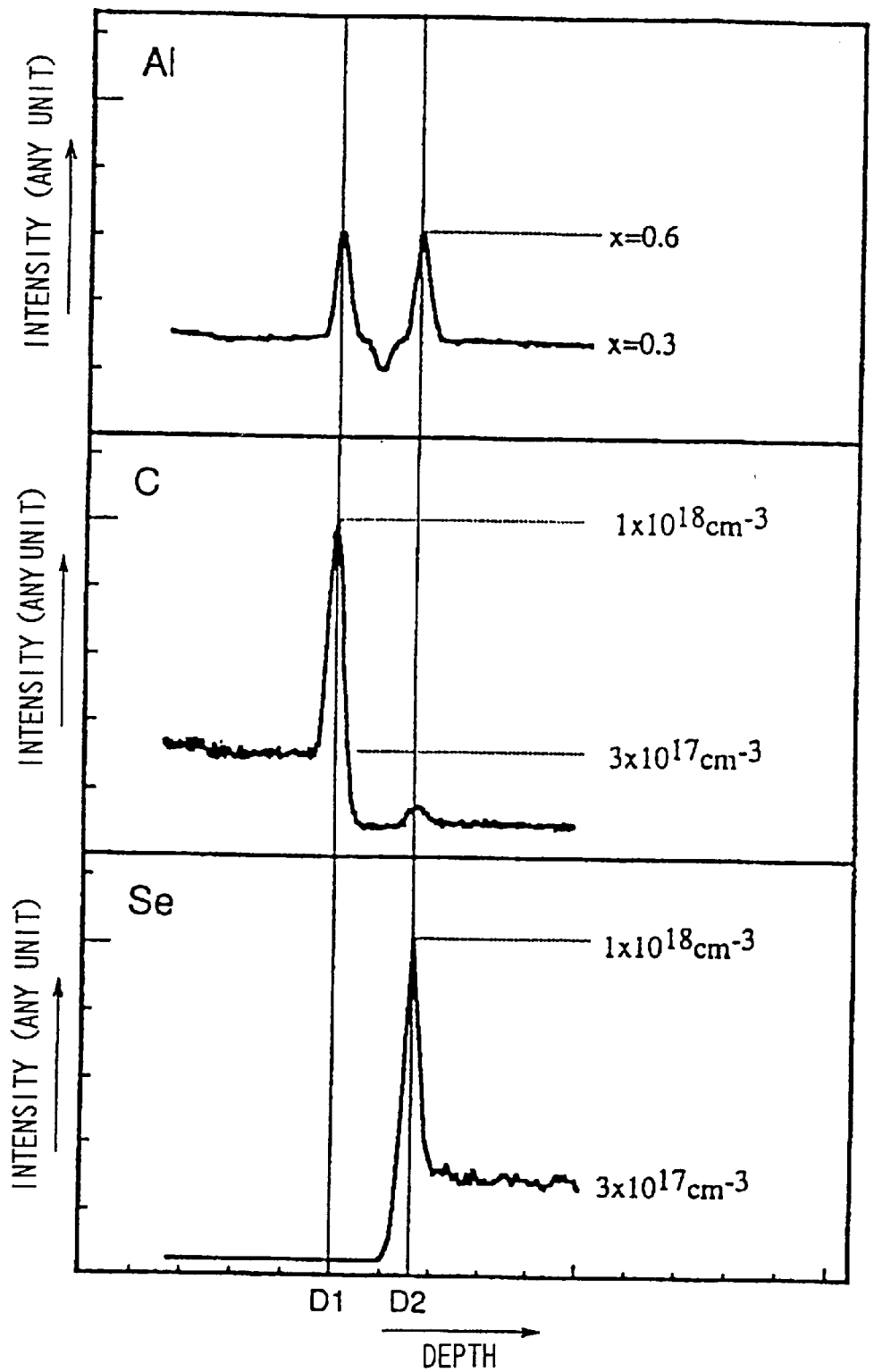
FIG. 8 is a profile diagram showing the concentration of various elements near the active layer in a sample corresponding to Embodiment 2 where carbon is used as the p-type dopant.
Figure 9:
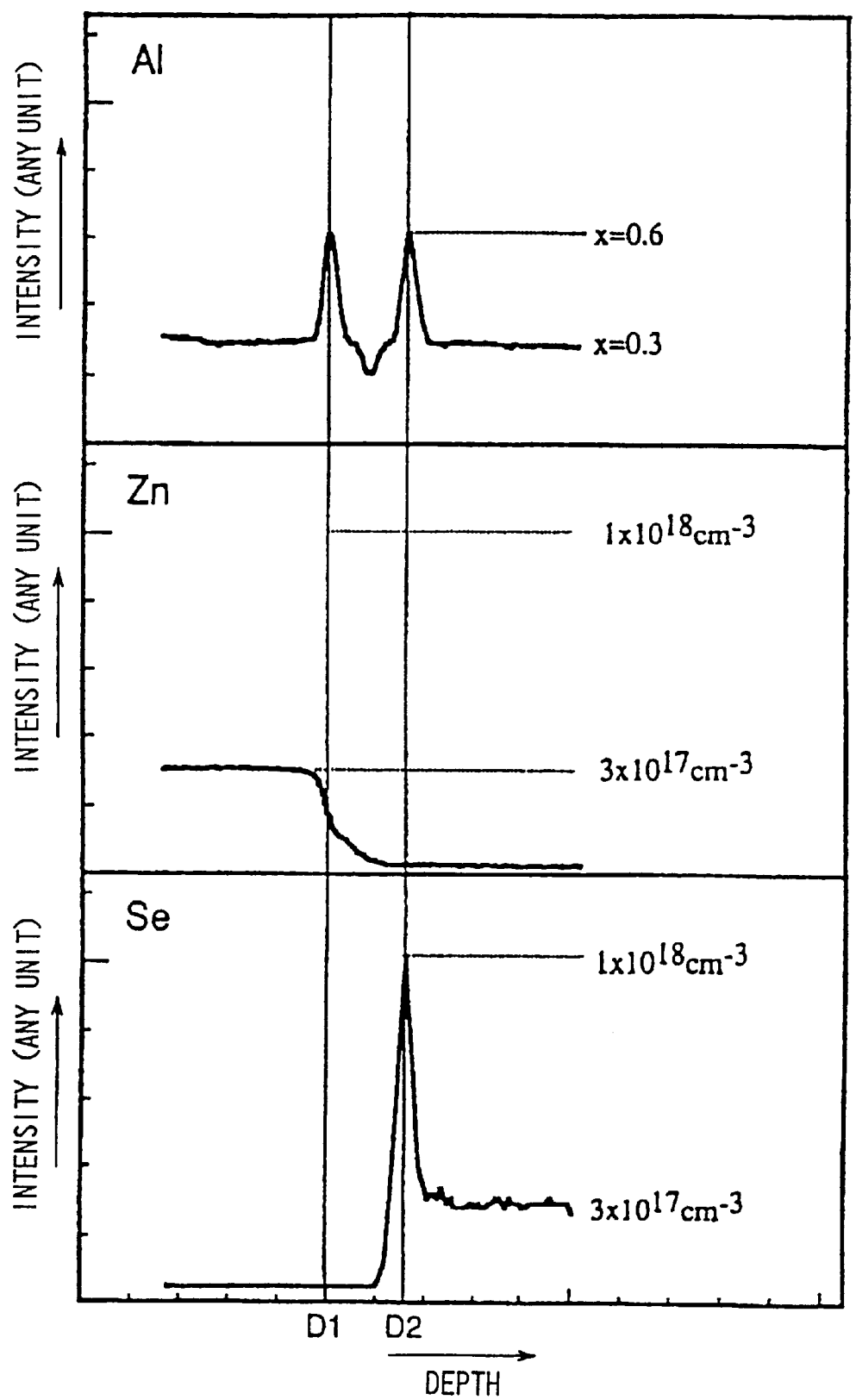
FIG. 9 is a profile diagram showing the concentration of various elements near the active layer in a sample corresponding to Comparison 2 where zinc is used as the p-type dopant.

FIG. 8 is a graphic diagram showing the concentration of various elements near the active layer in a sample corresponding to Embodiment 2 in which the p-type dopant is carbon (C). FIG. 9 is a similar diagram corresponding to Comparison 2 in which the p-type dopant is zinc (Zn). In both the cases, the n-type dopant is selenium (Se). Samples used in FIGS. 8 and 9 are intended for measurement of the concentration. The sample of FIG. 8 is distinguished from the sample of Embodiment 2 by the fact that the p-type carrier blocking layer is made of Al$_{0.60}$Ga$_{0.40}$As and the first clad layer is made of Al$_{0.30}$Ga$_{0.70}$As. Also, the sample of FIG. 9 is distinguished from the sample of Comparison 2 by the fact that the p-type carrier blocking layer is made of Al$_{0.60}$Ga$_{0.40}$As.

The profiles like those shown in FIGS. 5 and 6 show measurements of signal intensity with the element concentration detected by SIMS along the ordinates and a depth in the layer along the abscissa. The depth D1 corresponds to the position of the p-type carrier blocking layer and the depth D2 corresponds to the position of the n-type carrier blocking layer.

Referring to the Al content x shown in FIG. 8, it is intended that x=0.3 in the first p-type clad layer which is shallower than D1, x=0.6 at D1 in the p-type carrier blocking layer, x<0.3 in the active layer between D1 and D2, x=0.6 at D2 in the n-type carrier blocking layer, and x=0.3 in the first n-type clad layer which is deeper than D2.

The element concentration of carbon dc in FIG. 8 is $3 \times 10^{17}$ cm$^{-3}$ in a region shallower than D1, $1 \times 10^{18}$ cm$^{-3}$ at D2, and almost nil in a region deeper than D2.

Also, the element concentration of selenium ds in FIG. 8 is almost nil in a region shallower than D2, $1 \times 10^{18}$ cm$^{-3}$ at D2, and $3 \times 10^{17}$ cm$^{-3}$ in a region deeper than D2.

In FIG. 9, the Al content x and the selenium concentration ds show profiles similar to those in FIG. 8, both are substantially consistent to each other.

The element concentration of zinc dz in FIG. 9 is $3 \times 10^{17}$ cm$^{-3}$ in a region shallower than D1 and gradually declined towards D1. At D1, no peak is shown. As apparent, the diffusivity of zinc is high and when the carrier blocking layer is thin, zinc will easily escape to the other layers hence hardly producing a high doping concentration.

On the other hand, carbon is an element low in the diffusivity and its doping concentration can ideally be high even when the carrier blocking layer 15 is very thin. Magnesium shows such a similar profile as that of carbon.

The result of measuring the characteristic temperature and the internal loss of the semiconductor laser device of both Embodiment 2 and Comparison 2 are also shown in above Table 1 under the conditions including 700 μm of cavity length, 50 μm of current injection stripe width, and no optical coatings. The sample of Comparison 2 is distinguished from that of Embodiment 2 by the fact that zinc is doped as acceptor. As compared with Comparison 2, the characteristic temperature is remarkably improved from 90 K to 140 K.

The normalized frequency V of Embodiments 1 and 2 is π. The present invention may be implemented with the normalized frequency of π/3 or smaller. It is however preferred that the normalized frequency V is more than π/3 because the optical damage on the output end facets is suppressed to allow a higher output with ease.

Although both the first and second clad layers have a low concentration in Embodiment 2, the first clad layer which is nearer to the active layer only may have a low concentration. Embodiment 3.

Figure 10A:
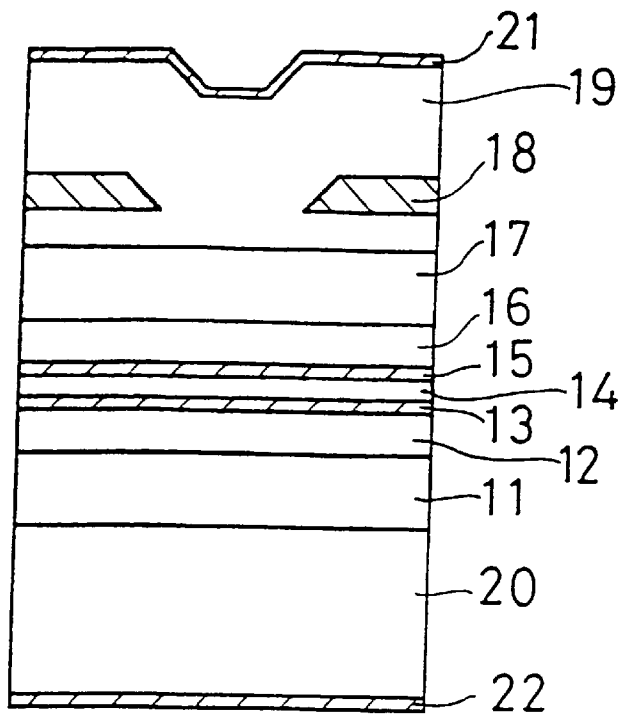
FIG. 10($a$) is a cross sectional view showing a third embodiment of the present invention while FIG. 10($b$) is an enlarged cross sectional view of an active layer 14.
Figure 10B:
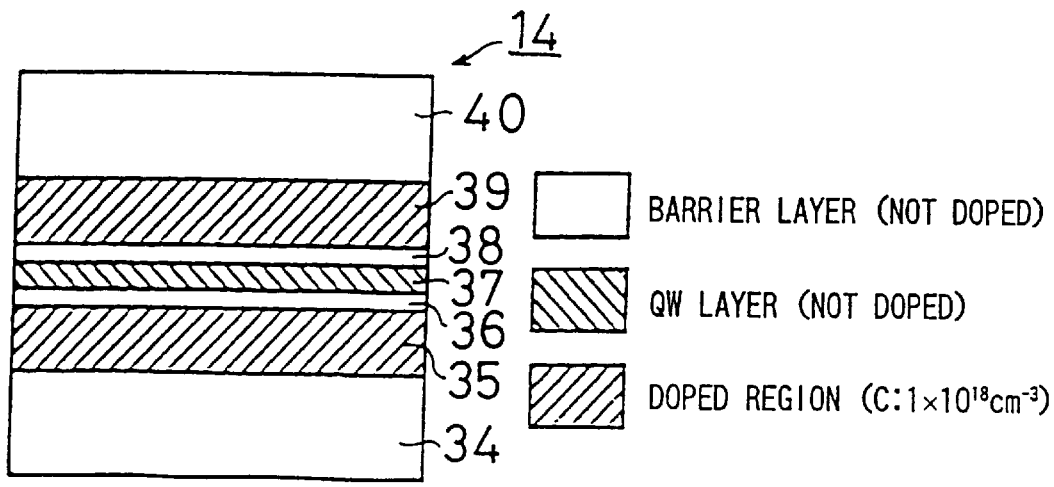
Figure 11:
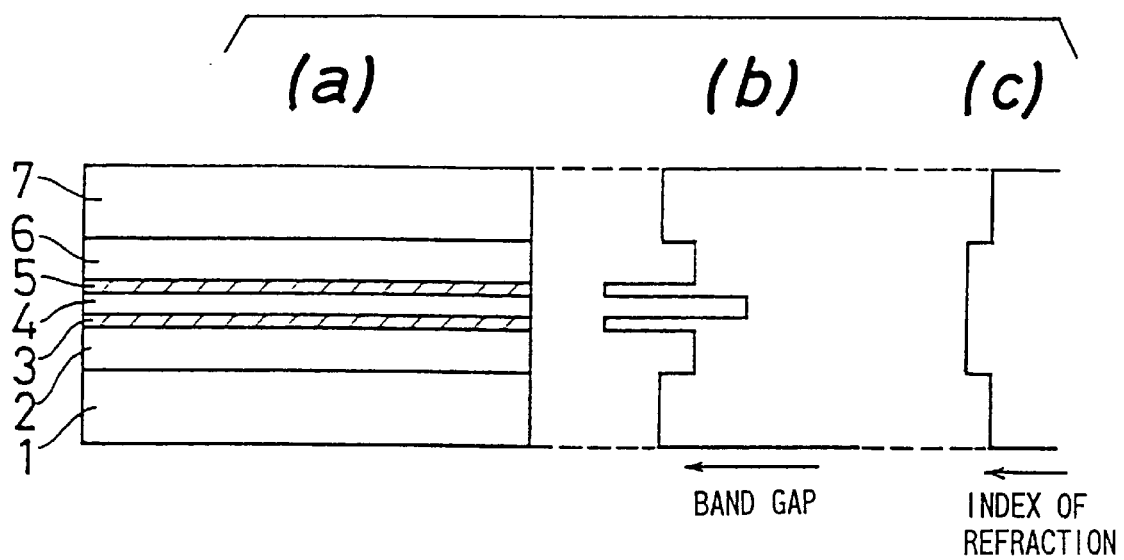
FIG. 11($a$) is a cross sectional view showing a conventional semiconductor laser device, FIG. 11($b$) is a profile diagram of band gaps of respective layers.
Figure 12A:
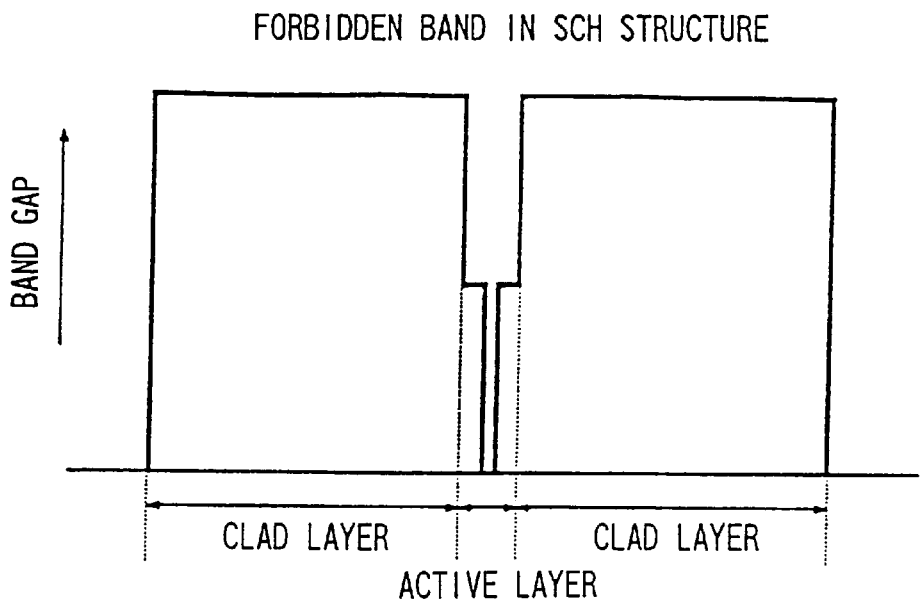
FIG. 12($a$) is a band gap diagram of a semiconductor laser device having an SCH structure while FIG. 12($b$) is a band gap diagram of a semiconductor laser device having a perfect-SCH structure.
Figure 12B:
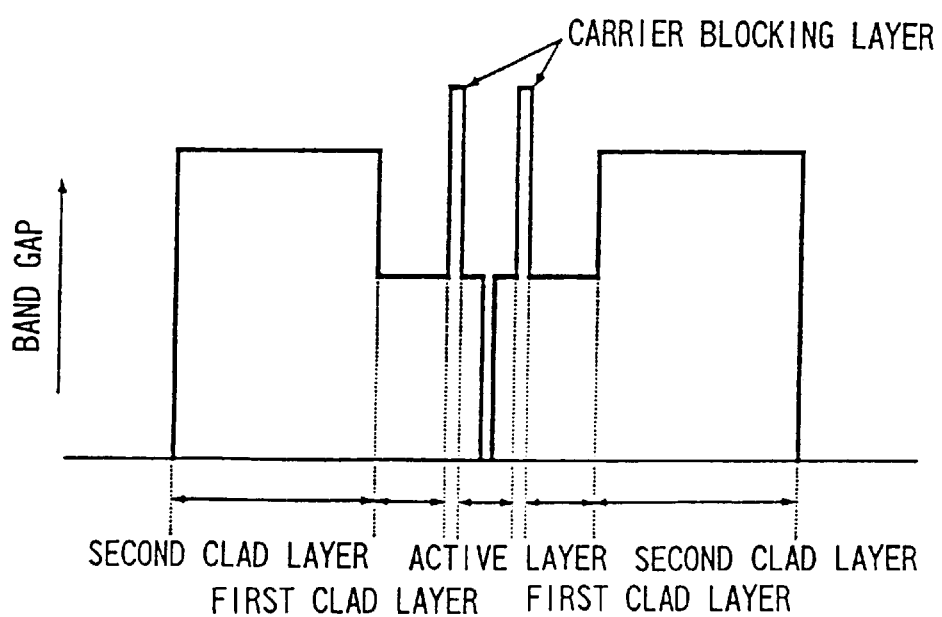

FIG. 10(*a*) is a cross sectional view showing a third embodiment of the present invention. FIG. 10(*b*) is an enlarged cross sectional view of an active layer 14.

In this semiconductor laser device on a semiconductor substrate (n-GaAs) 20 formed in sequence are a second n-type clad layer (n-Al$_{0.48}$Ga$_{0.52}$As with a donor concentration of $1 \times 10^{18}$ cm$^{-3}$ and a thickness of 0.7 μm) 11, a first n-type clad layer (n-Al$_{0.30}$Ga$_{0.70}$As with a donor concentration of $3 \times 10^{17}$ cm$^{-3}$ and a thickness of 0.4 μm) 12, an n-type carrier blocking layer (n-Al$_{0.60}$Ga$_{0.40}$As with a donor concentration of $1 \times 10^{18}$ cm$^{-3}$ and a thickness of 0.014 μm) 13, an active layer (SWQ: single-quantum well) 14, a p-type carrier blocking layer (p-Al$_{0.50}$Ga$_{0.50}$As with an acceptor concentration of $1 \times 10^{18}$ cm$^{-3}$ and a thickness of 0.021 μm) 15, a first p-type clad layer (p-Al$_{0.30}$Ga$_{0.70}$As with an acceptor concentration of $3 \times 10^{17}$ cm$^{-3}$ and a thickness of 0.4 μm) 16, a second p-type clad layer (p-Al$_{0.48}$Ga$_{0.52}$As with an acceptor concentration of $1 \times 10^{18}$ cm$^{-3}$ and a thickness of 0.7 μm) 17, a current constriction layer (n-GaAs with a donor concentration of $1 \times 10^{18}$ cm$^{-3}$ and a thickness of 0.3 μm) 18, and a p-type contact layer (p-GaAs with an acceptor concentration of $3 \times 10^{17}$ cm$^{-3}$ to $3 \times 10^{19}$ cm$^{-3}$ and a thickness of 2 μm) 19 by MOCVD, where Se is doped as donor and C is doped as acceptor except the p-type contact layer where Zn is doped.

Ohmic electrodes 21 and 22 are provided on the top of the p-type contact layer 19 and the bottom of the semiconductor substrate 20 respectively. Incidentally a laser beam is propagated along a direction vertical to the sheet of paper and oscillated between the two end facets constituting an optical resonator.

As shown in FIG. 10(*b*), the active layer 14 has a single-quantum well structure, where formed in upward sequence are an undoped barrier layer (Al$_{0.30}$Ga$_{0.70}$As with a thickness of 0.038 μm) 34, a p-type doped barrier layer (p-Al$_{0.30}$Ga$_{0.70}$As with a carbon doped acceptor concentration of $1 \times 10^{18}$ cm$^{-3}$ and a thickness of 0.010 μm) 35, an undoped barrier layer (Al$_{0.30}$Ga$_{0.70}$As with a thickness of 0.002 μm) 36, a quantum well layer (GaAs with no doping and a thickness of 0.004 μm) 37, an undoped barrier layer (Al$_{0.30}$Ga$_{0.70}$As with a thickness of 0.002 μm) 38, a p-type doped barrier layer (p-Al$_{0.30}$Ga$_{0.70}$As with a carbon doped acceptor concentration of $1 \times 10^{18}$ cm$^{-3}$ and a thickness of 0.010 μm) 39. and an undoped barrier layer (Al$_{0.30}$Ga$_{0.70}$As with a thickness of 0.038 μm) 40.

It should be noted that particular ones of the barrier layers in the single-quantum well structure of the active layer 14 are doped with carbon. The holes formed by the carbon doping are localized in the quantum well layers to contribute to the increase of optical gain. As the result, the quasi-Fermi level descends and the potential barrier in each carrier blocking layer ascends relatively. As the efficiency of carrier confinement is increased, the characteristic temperature of the semiconductor laser device will be improved. Also, the quantum well layers can be maintained undoped, avoiding broadening of the light emission spectrum.

For comparison, a semiconductor laser device was prepared in which the p-type doped barrier layers 35 and 39 are replaced by undoped barrier layers. It was found through measurement under the common conditions including 1500 μm of cavity length, 50 μm of current injection stripe width, and no optical coating that the characteristic temperature representing the temperature dependence of oscillation threshold is 110 K in the comparison and 140 K in Embodiment which is about 30% higher.

In this Embodiment described above the p-type doped barrier layers 35 and 39 are doped with carbon, they may be doped with magnesium or the like which is low in the diffusivity.

The active layer 14 is not limited to the single-quantum well structure but may consist of a multi-quantum well structure (MQW) having two or more quantum wells.

In these embodiments described above the semiconductor laser devices employ an AlGaAs base semiconductor compound, they may employ any other appropriate material in which carbon or magnesium can be used as p-type dopant.

ADVANTAGEOUS EFFECT OF INVENTION

As set forth above, the present invention allows the p-type carrier blocking layers to be doped with carbon or magnesium and, even when the carrier blocking layers are thin, have an adequate doping concentration, hence ensuring the carrier confinement into the active layer by the carrier blocking layer. This will largely contribute to the improvement of the characteristic temperature. Also, the quantum well layers can remain undoped hence avoiding broadening of the light emission spectrum.

In addition, the concentration of free carriers in the clad layers in which light is propagated can be reduced, whereby the internal loss can be decreased. The optical damage on the output end facets can be suppressed thus permitting a higher output.

The present invention also allows the barrier layer in the quantum well structure of the active layer to be doped with carbon or magnesium to increase the concentration of holes in each quantum well. This lowers the quasi-Fermi level of electrons in the active layer hence decreasing the probability of electrons overflow from the active layer. Accordingly, the efficiency of carrier confinement in the active layer can be improved thus improving the laser oscillation efficiency and the characteristic temperature.

As the result, a high-efficiency, high-output semiconductor laser device with perfect SCH can be obtained.

We claim:

1. A semiconductor laser device comprising n-type and p-type clad layers disposed on both sides of an active layer; and n-type and p-type carrier blocking layers which are adjacent to the active layer and have wider band gaps than those of the active layer and the clad layers, characterized in that a dopant of the p-type carrier blocking layer is carbon or magnesium.

2. The semiconductor laser device set forth in claim 1, characterized in that modulation doping is applied to the n-type and p-type carrier blocking layers so that doping amounts of the n-type and p-type carrier blocking layers are larger than that of at least one of the n-type and p-type clad layers adjacent to the carrier blocking layers.

3. The semiconductor laser device set forth in claim 2, characterized in that modulation doping is applied so that doping amounts of the n-type and p-type carrier blocking layers are $1 \times 10^{18}$ cm$^{-3}$ or more, a doping amount of at least one of the n-type and p-type clad layers adjacent to the carrier blocking layers is $3 \times 10^{17}$ cm$^{-3}$ or less.

4. A semiconductor laser device comprising n-type and p-type clad layers disposed on both sides of an active layer; and n-type and p-type carrier blocking layers which are adjacent to the active layer and have wider band gaps than those of the active layer and the clad layers, characterized in that the active layer has a single-quantum or multi-quantum well structure composed of quantum well layers and barrier layers of which band gap is wider than that of the quantum well layers, and the barrier layers are doped with carbon or magnesium.

5. The semiconductor laser device set forth in claim 4, characterized in that the doping concentration exists within a range of $1 \times 10^{17}$ to $1 \times 10^{19}$ cm$^{-3}$.

6. The semiconductor laser device set forth in claim 1, characterized in that each of the n-type and p-type clad layers comprises, in order from the active layer side, a first clad layer and a second clad layer, and when a normalized frequency V is defined as follows: $V = (\pi \cdot d1/\lambda) \cdot (N1^2 - N2^2)^{0.5}$ wherein $\pi$ is the circular constant, $\lambda$ is the oscillation wavelength, N1 is the maximum refractive index of the first clad layer, N2 is the refractive index of the second clad layer, and d1 is the effective thickness between the two second clad layers, the normalized frequency V satisfies $V > \pi/3$.

7. The semiconductor laser device set forth in claim 1, characterized in that the carrier blocking layers and the clad layers are formed of a III–V group semiconductor compound.

8. The semiconductor laser device set forth in claim 7, characterized in that the carrier blocking layers and the clad layers are formed of an AlGaAs base semiconductor compound.

9. The semiconductor laser device set forth in claim 1, characterized in that the quantum well layers and the barrier layers are formed of a III–V semiconductor compound.

10. The semiconductor laser device set forth in claim 9, characterized in that the quantum well layers and the barrier layers are formed of an AlGaAs base semiconductor compound.

* * * * *